United States Patent

Iida et al.

[15] 3,660,734

[45] May 2, 1972

[54] BOND TYPE DIODE UTILIZING TIN-DOPED GALLIUM ARSENIDE

[72] Inventors: Shinya Iida, Hino-shi; Hitoshi Sato, Nishitama-gun; Yutaka Takeda, Nakano-ku, all of Japan

[73] Assignee: Hitachi, Ltd., Tokyo, Japan

[22] Filed: Sept. 9, 1969

[21] Appl. No.: 856,451

[30] Foreign Application Priority Data

Sept. 9, 1968 Japan....................................43/64258

[52] U.S. Cl...............317/235 R, 317/235 UA, 317/235 AL, 317/235 AN, 317/235 AQ

[51] Int. Cl.......................................H01l 11/00, H01l 15/00

[58] Field of Search.....................317/234, 235, 31, 48, 48.2, 317/48.4; 29/587, 590

[56] References Cited

UNITED STATES PATENTS

| | | | |
|---|---|---|---|
| 3,286,137 | 11/1966 | Luescher et al. | 317/235 |
| 3,448,349 | 6/1969 | Sumner | 317/235 |
| 3,457,468 | 7/1969 | Kawaji | 317/235 |
| 3,523,045 | 8/1970 | Suzuki et al. | 317/235 |
| 3,451,912 | 6/1969 | D'Heurle et al. | 317/235 X |
| 3,114,088 | 12/1963 | Abercrombie | 317/235 |

*Primary Examiner*—John W. Huckert
*Assistant Examiner*—Andrew J. James
*Attorney*—Craig, Antonelli & Hill

[57] ABSTRACT

A bond type diode which is composed of gallium arsenide doped with tin within the range of $1 \times 10^{16}$ to $5 \times 10^{17}$ atoms/cm$^3$, preferably about $3 \times 10^{17}$ atoms/cm$^3$, of a gold wire containing zinc welded onto a portion of a surface of the tin-doped gallium arsenide, and of an electrode in ohmic contact with the tin-doped gallium arsenide at a portion different from the welded portion.

7 Claims, 2 Drawing Figures

Figure 1:
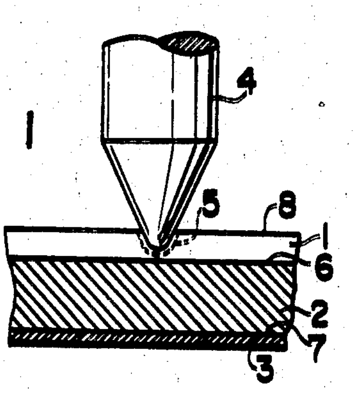

INVENTORS
SHINYA IIDA, HITOSHI SATO and
YUTAKA TAKEDA
BY Craig, Antonelli, Stewart & Hill
ATTORNEYS

BOND TYPE DIODE UTILIZING TIN-DOPED GALLIUM ARSENIDE

This invention relates to a novel bond type diode provided with excellent high frequency characteristics.

Point-contact type diodes are known to be structurally relatively simple and inexpensive and still utilizable up to relatively high frequencies. On the other hand, the diodes of this type entail the drawbacks of a high forward resistance due to the small contact area thereof possess characteristics inferior to those of an ideal p-n junction because of the pressure applied to the junction part and exhibit a readily changeable performance due to the displacement of the contact by shock, etc.

The bond type diode was invented, therefore, in order to prevent these drawbacks while retaining the excellent properties and simple structure of the point contact type.

The bond type diode is normally composed of a semiconductor body of either one of the two types consisting of *p* and *n*, a metal wire of the other one of these two types, of which one end is welded to the body, and an electrode in ohmic contact with the body over a portion other than the welded part thereof. The semiconductor can usually be composed of silicon or germanium, but excellent high frequency characteristics can be advantageously obtained by *n*-type gallium arsenide which is characterized by lower resistance and higher electron mobility compared with silicon or germanium. The aforementioned metal wire is usually made of gold which is chemically stable, has excellent working properties and forms an alloy with silicon and germanium at relatively low temperature, but may also be composed of other metals such as aluminum, silver, platinum, copper, tungsten, etc.

Prior bond type diodes employing gallium arsenide were manufactured by forming a gallium arsenide semiconductive layer 2–4 microns thick, by gaseous-phase epitaxial growing on an $n^+$-type gallium arsenide base plate while doping the base plate with tellurium, and welding a gold wire containing zinc to the thus-grown semiconductive layer.

In this structure, due to the relatively large resistance distribution of the gallium arsenide semiconductive layer, the yield potential of the thus-obtained welded portion (junction) is decreased as this portion becomes larger due to the higher electric power used in welding the gold wire to the gallium arsenide semiconductive layer, or, stated differently, as the boundary of the welded portion approaches the $n^+$-type gallium arsenide base plate. Moreover, uniform characteristics cannot be expected unless the welding of the gold wire is always realized at a constant position on the surface of the gallium arsenide semiconductive layer.

Consequently, the production of prior art bond type diodes of uniform characteristics requires a very accurate control of electric power for welding the gold wire to the gallium arsenide semiconductive layer as well as of the position of the gold wire on the surface of the semiconductive layer. Thus, it has been extremely difficult heretofore to produce bond type diodes of uniform characteristics in industrial quantity.

The object of this invention is to provide improved bond type diodes employing gallium arsenide which are free from the drawbacks mentioned above, and this object is realized by employing gallium arsenide doped with tin as the semiconductor body of the bond type diode.

The present inventors have discovered, as a result of investigations over a long period of time, that the drawbacks mentioned above can be overcome by utilizing gallium arsenide doped with tin as the semiconductor body of a bond type diode, and this phenomenon is presumed, though theoretically not yet clarified, to be based on the fact that tin doping realizes a more uniform concentration and a larger mobility than doping with any other *n*-type impurities and that the very small autodoping effect of a tin doped layer prevents the formation of a concentration gradient in the grown layer of gallium arsenide.

The concentration of tin added to gallium arsenide in order to realize the object of this invention should preferably be in the range of $1 \times 10^{16}$ to $5 \times 10^{17}$ atoms/cm$^3$, since a concentration lower than $1 \times 10^{16}$ atoms/cm$^3$ results in a high resistance of the gallium arsenide layer leading to deteriorated high frequency characteristics while a concentration higher than $5 \times 10^{17}$ atoms/cm$^3$ gives rise to an excessively low durable voltage of the junction. Furthermore, according to the present invention, a bond type diode adapted for use at high frequencies can be obtained by keeping the metal wire in contact with the layer prepared by epitaxial growth on a gallium arsenide base plate of usually low specific resistance and supplying a pulse current to the contact part, thereby welding the metal wire to the epitaxial layer to obtain the diode junction.

The diameter of the junction to be formed on the surface of the epitaxial layer should be, in case of a high frequency diode, in the range of 1–10 microns, since a diameter smaller than 1 micron will lead to insufficient mechanical strength and thus to a low yield of production while a diameter larger than 10 microns will result in a larger junction capacity and therefore will be inappropriate for high frequency application. Further, the thickness of the epitaxial layer composed of gallium arsenide doped with tin should not exceed twice the diameter of the junction and should be larger than the maximum depth of this junction.

This invention will be further clarified by the following explanation making particular reference to the attached drawings.

Figure 2:
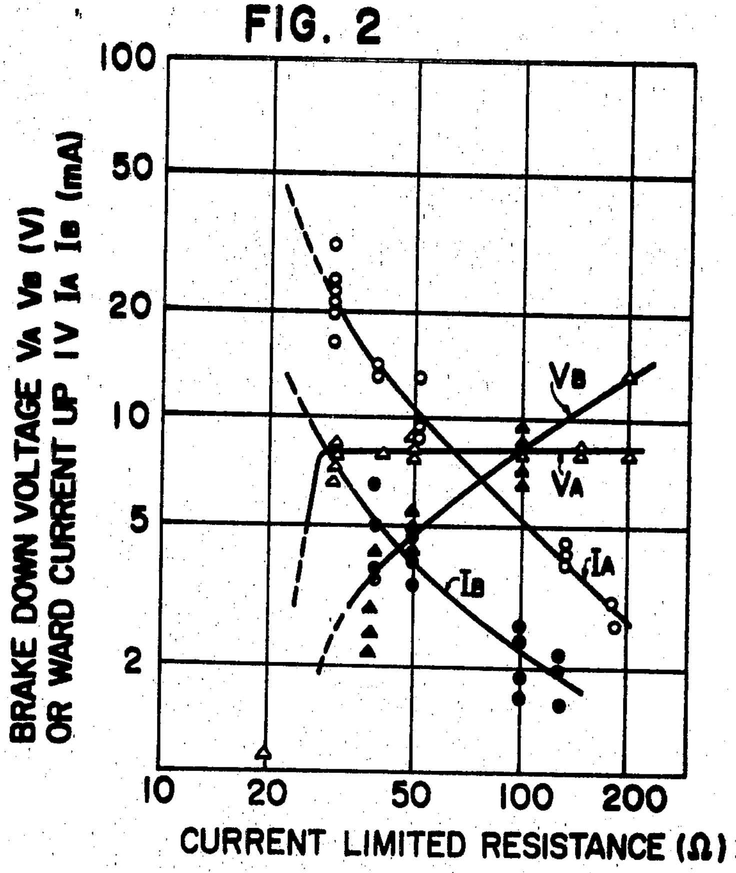

FIG. 1 shows in cross section an example of a diode embodying the present invention, and FIG. 2 diagrammatically shows the characteristics of the diode obtained according to this invention compared with those of prior bond type diodes.

The bond type diode, shown in FIG. 1 representing an example embodying the present invention, is composed of a gallium arsenide single crystal layer 1 of about 2 microns thick doped with tin $3 \times 10^{17}$ cm$^{-3}$, a gallium arsenide single crystal base plate 2 of about 300 microns thick, doped with tellurium and having a specific resistance of $8 \times 10^{-4}$ Ω cm, and in contact with a surface 6 of the single crystal layer 1, a tin electrode 3 welded to a surface 7 of the gallium arsenide single crystal base plate 2, the surface 7 being opposite to the surface in contact with the gallium arsenide single crystal layer 1 doped with tin, and a thin gold wire 4 containing zinc welded onto a surface 8 of the gallium arsenide single crystal layer 1 on the side opposite to the surface 6 in contact with the gallium arsenide single crystal base plate 2. A p-n junction is formed between the gallium arsenide single crystal layer 1 doped with tin and the gold-zinc wire 4.

The bond type diode of this structure shows improved characteristics compared with prior bond type diodes composed of gallium arsenide doped with tellurium and with a gold-zinc wire welded thereto.

FIG. 2 shows yield potentials against current limiting resistance and forward currents at 1 V observed in a bond type diode according to this example and in the bond type diodes of the prior art. In this figure $V_A$, $I_A$, and $V_B$, $I_B$, respectively, illustrate the yield potential and forward current of the bond type diode of the example of the present invention and those of a prior bond type diode. As can be readily observed from this figure, the bond type diode according to this example shows a stable yield potential over a wide variation of electric bond power employed for welding the gold-zinc wire 4 to the gallium arsenide single crystal layer 1 while that of the prior type shows a gradual decrease with an increase of bond power. Additionally, the bond type diode of this example has a high forward current in comparison with the prior art diode and therefore is suitable for high power applications.

The bond type diode of the above example can be easily manufactured by utilizing the semiconductor techniques already known.

A gallium arsenide single crystal base plate doped with tellurium of 300 microns thick having a specific resistance of $8 \times 10^{-4}$ Ω cm and a gallium arsenide crystal doped with tin at a concentration of $3 \times 10^{-17}$ cm$^{-3}$ are placed in different positions of a crystal growing reaction tube, the interior of which is substituted with hydrogen. Then the base plate and the gallium arsenide doped with tin are heated respectively at 750° and 850° C. and arsenic trichloride gas is introduced at a rate of about 100 cc/min. together with hydrogen gas into the reaction tube. After a reaction for about 2 hours, a gallium arsenide single crystal about 2 microns thick and doped with tin at a rate of $3 \times 10^{17}$ cm$^{-3}$ is formed on the gallium arsenide single crystal base plate. Then tin welder is alloyed onto a surface of the base plate opposite to the surface on which the gallium arsenide single crystal layer is formed to thereby form an electrode. Then a thin gold-zinc wire is brought into contact with the surface of the tin-doped gallium arsenide single crystal layer formed on the base plate, and an electric power of 100mW (7 – 10 half-wave pulses) is applied onto the contact point through the electrode and the wire is thereby welded to the tin doped gallium arsenide single crystal to form a p - n junction. Thus the bond type diode is completed.

Though this invention has merely described a bond type diode provided with a p-n junction, it may also be advantageously utilized in bond type diodes with other types of junction such as Schottky junction. More particularly, a Schottky diode can be prepared by welding to a tin-doped gallium arsenide single crystal, a metal capable of deciding the type of conductivity of the single crystal such as gold or nickel.

The present invention which has thus far been explained in detail, is principally characterized by the use of gallium arsenide doped with tin as the semiconductor body of the bond type diode, and therefore is not limited to the above-mentioned example which is merely given as a preferred embodiment of this invention. Thus, the metal wire can be composed not only of gold-zinc, as in the above example, but also of other metals such as platinum, silver, copper, tungsten, aluminum, etc., and the electrode can be made of any metal capable of forming an ohmic contact with the semiconductive layer. Furthermore, the use of gallium arsenide of low resistance as the base plate for growing tin-doped gallium arsenide thereon in the above example is preferable but not indispensable to the present invention since the base plate only operates as an electrode.

In summary, this invention enables to realize a bond type diode having a more stable yield potential and a larger forward current compared to the prior bond type diodes. Furthermore, tin-doped gallium arsenide employed in this invention shows also a decreased impurity gradient compared to prior tellurium-doped gallium arsenide and therefore is capable of exhibiting the effect of a resistance connected in series thereby enabling to realize a diode with a decreased conversion loss when used in a receiving converter, for example, 5.7 dB at 47 gigaHz.

We claim:

1. A bond type diode comprising a tin-doped gallium arsenide, a metal wire welded onto a portion of a surface of said gallium arsenide to form a junction with said gallium arsenide, and an electrode in ohmic contact with said gallium arsenide at a portion thereof different from said welded portion, characterized by a concentration of tin in the tin-doped gallium arsenide layer within the range of $1 \times 10^{16} - 5 \times 10^{17}$ atoms/cm$^3$.

2. A bond type diode according to claim 1, characterized by impurities in said metal wire capable of forming a p-n junction with said gallium arsenide thereby to form a p-n junction between said wire and gallium arsenide.

3. A bond type diode according to claim 1, wherein the diameter of the junction is within the range of about 1–10 microns.

4. A bond type diode according to claim 1, characterized by a Schottky junction.

5. A bond type diode comprising a semiconductor base plate, a tin-doped gallium arsenide disposed on said base plate, a metal wire welded onto a portion of a surface of said gallium arsenide to form a junction with said gallium arsenide, and an electrode in ohmic contact with said base plate provided at a portion of the base plate, characterized by a concentration of tin in the tin-doped gallium arsenide layer within the range of $1 \times 10^{16} - 5 \times 10^{17}$ atoms/cm$^3$.

6. A bond type diode according to claim 5, wherein the diameter of the junction is within the range of about 1 – 10 microns.

7. A bond type diode according to claim 5, wherein said semiconductor base plate is of gallium arsenide.

* * * * *